(12) United States Patent
Brechignac et al.

(10) Patent No.: US 6,597,020 B1
(45) Date of Patent: Jul. 22, 2003

(54) PROCESS FOR PACKAGING A CHIP WITH SENSORS AND SEMICONDUCTOR PACKAGE CONTAINING SUCH A CHIP

(75) Inventors: Remi Brechignac, Grenoble (FR); Juan Exposito, St. Nazaire les Eymes (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/648,843

(22) Filed: Aug. 25, 2000

(30) Foreign Application Priority Data

Aug. 27, 1999 (FR) .............................. 99 10841

(51) Int. Cl.[7] .............................................. H01L 33/00
(52) U.S. Cl. ........................ 257/100; 257/99; 257/678; 257/684; 257/698; 257/707
(58) Field of Search ...................... 257/666, 676–702, 257/99, 100

(56) References Cited

U.S. PATENT DOCUMENTS

| | | | |
|---|---|---|---|
| 4,165,226 A | * | 8/1979 | Kita |
| 5,719,440 A | | 2/1998 | Moden |
| 6,117,705 A | * | 9/2000 | Glenn et al. |
| 6,150,193 A | * | 11/2000 | Glenn |
| 6,313,524 B1 | * | 11/2001 | Pueschner et al. |

FOREIGN PATENT DOCUMENTS

| | | | |
|---|---|---|---|
| GB | 2 136 210 A | | 9/1984 |
| WO | WO 89/04552 | | 5/1989 |

OTHER PUBLICATIONS

Preliminary Search Report dated May 9, 2000 for French Patent Application No. 99 10841.

* cited by examiner

*Primary Examiner*—Fetsum Abraham
(74) *Attorney, Agent, or Firm*—Lisa K. Jorgenson; Stephen Bongini; Fleit, Kain, Gibbons, Gutman & Bongini P.L.

(57) ABSTRACT

A method is provided for packaging an integrated circuit chip that has a front face with sensors located in a central region and electrical connection areas located in a region that lies between at least one edge of the chip and the central region. According to the method, a rear face of the chip is cemented to a front face of a substrate that includes through-holes, with the rear face of the substrate including electrical connection areas that pass in front of the through-holes such that the through-holes are located laterally with respect to the edge of the chip. The electrical connection areas on the front face of the chip are connected to the electrical connection areas on the substrate through the through-holes, and the chip is embedded in an optically transparent encapsulating material so as to form an encapsulating block on the same side as the front face of the substrate. The substrate is cut around the encapsulating block, following the perimeter of the encapsulating block. Also provided is a semiconductor package that includes an integrated circuit chip, a substrate, electrical connectors, and an encapsulating material.

24 Claims, 3 Drawing Sheets

PROCESS FOR PACKAGING A CHIP WITH SENSORS AND SEMICONDUCTOR PACKAGE CONTAINING SUCH A CHIP

CROSS-REFERENCE TO RELATED APPLICATIONS

This application is based upon and claims priority from prior French Patent Application No. 99-10841, filed Aug. 27, 1999, the entire disclosure of which is herein incorporated by reference.

BACKGROUND OF THE INVENTION

1. Field of the Invention

The present invention relates to integrated circuits, and more specifically to a process for packaging an integrated circuit chip having sensors and a semiconductor device or package containing such a chip.

2. Description of Related Art

In order to package an integrated circuit chip that has sensors on its front face, the rear face of the chip is cemented to a rigid ceramic substrate and the terminals of the chip are electrically connected by connection wires to connection areas on the front face of the substrate. The substrate has electrical connection tracks which go around its edges so as to electrically connect its front connection areas to the rear connection areas. Then, in some packages, a lid extending in front of the front face of the chip is cemented. In other packages, the chip and the connection wires are then embedded in a transparent encapsulating resin.

Due to the materials and the electrical connection methods that are used, such packages necessarily have a square or rectangular outline that follows the outline of the chip. Furthermore, the fabrication cost for such packages is relatively high.

SUMMARY OF THE INVENTION

In view of these drawbacks, it is an object of the present invention to overcome the above-mentioned drawbacks and to provide a simpler and reduced cost process for packaging a chip with sensors, while increasing options of subsequent use.

One embodiment of the present invention provides a method for packaging an integrated circuit chip that has a front face with sensors located in a central region and electrical connection areas located in a region that lies between at least one edge of the chip and the central region. According to the method, a rear face of the chip is cemented to a front face of a substrate that includes through-holes, with the rear face of the substrate including electrical connection areas that pass in front of the through-holes such that the through-holes are located laterally with respect to the edge of the chip. The electrical connection areas on the front face of the chip are connected to the electrical connection areas on the substrate through the through-holes, and the chip is embedded in an optically transparent encapsulating material so as to form an encapsulating block on the same side as the front face of the substrate. The substrate is cut around the encapsulating block, following the perimeter of the encapsulating block. In a preferred method, the electrical connection areas on the front face of the chip are connected to the electrical connection areas on the substrate using connection wires, and the connection wires are also embedded in the encapsulating material.

Another embodiment of the present invention provides a semiconductor package that includes an integrated circuit chip, a substrate, electrical connectors, and an encapsulating material. The chip has a front face with sensors in a central region and electrical connection areas in a region between at least one edge and the central region, and the substrate has a front face listened to a rear face of the chip and a rear face having electrical connection areas that pass in front of the through-holes and are located laterally with respect to the edge of the chip. The electrical connectors connect the connection areas on the front face of the chip to the electrical connection areas on the substrate through the holes. The encapsulating material is optically transparent and forms an encapsulating block in which the chip and electrical connectors are embedded. Further, the encapsulating block is affixed to the front face of the substrate, and the perimeter of the substrate follows the perimeter of the encapsulating block. In one preferred embodiment, the perimeter of the encapsulating block is circular and the front face of the encapsulating block has a domed part that forms an optical lens.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
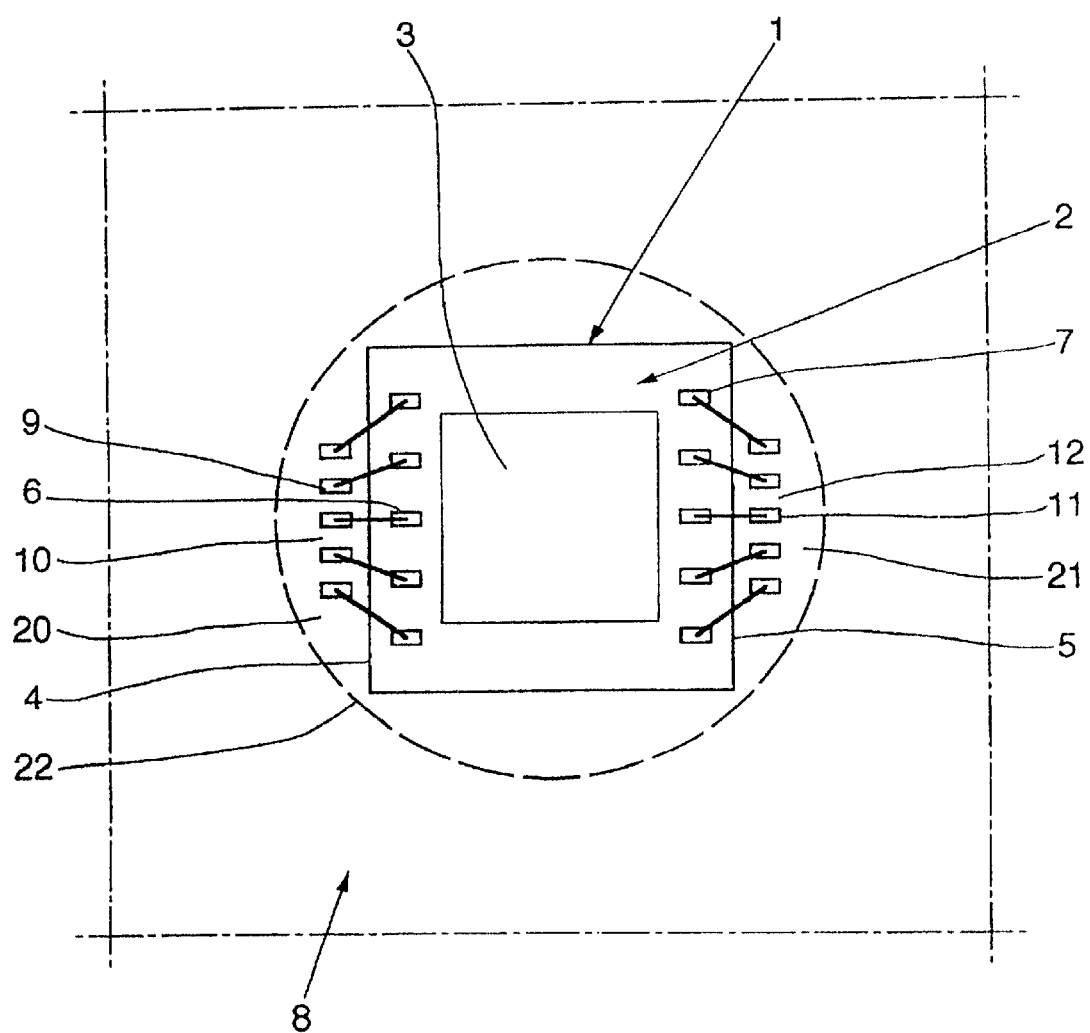
FIG. 1 shows a top view of a semiconductor device after a first step of a process for packaging a chip in accordance with one embodiment of the present invention.

Preferred embodiments of the present invention will be described in detail hereinbelow with reference to the attached drawings.

A preferred embodiment of the present invention provides a process for packaging an integrated circuit chip that has a front face with sensors (e.g., optical sensors) in its central region and electrical connection areas in a region that lies between at least one of its edges and the central region. According to the process, a rear face of the chip is cemented to a front face of a substrate that includes through-holes, with the rear face of the substrate having electrical connection areas that pass in front of the through-holes such that the through-holes are located laterally with respect to the edge of the chip.

The connection areas on the front face of the chip are connected to the connection areas on the substrate through the through-holes using connection wires, and the chip and the connection wires are embedded in an optically transparent encapsulating material to form an encapsulating block on the same side as the front face of the substrate. The substrate is cut around the encapsulating block, following the perimeter of this block. In one preferred embodiment, a block whose perimeter is circular is formed and the substrate is cut along the circular perimeter of this block. In some embodiments, the substrate is cut by punching.

Further, one embodiment of the present invention provides a semiconductor package with sensors such as optical sensors. The package includes an integrated circuit chip, a substrate, electrical connection wires, and an optically transparent encapsulating material. The integrated circuit chip has a front face with optical sensors in its central region and electrical connection areas between at least one of its edges and the central region. The substrate has a front face that is attached to rear face of the chip and a rear face with electrical connection areas that pass in front of the through-holes.

The electrical connection wires connect the connection areas on the front face of the chip to the electrical connection areas oil the substrate through the holes, and the optically transparent encapsulating material forms an encapsulating block in which the chip and the connection wires are embedded. The block is affixed to the front face of the substrate, and the perimeter of the substrate follows the perimeter of the encapsulating block. In a preferred embodiment, the perimeter of the block is circular and the cut perimeter of the substrate then is also circular. In some embodiments, the substrate is a film such as an epoxy resin that has screen-printed or laminated connection areas.

FIGS. 1 through 5 show a semiconductor device formed using a process for packaging a chip in accordance with one embodiment of the present invention. As shown, there is an integrated circuit chip 1 of parallelepipedal shape with a square outline. The chip has a central region 3 on its front face 2 that contains multiple optical sensors. The outline of the central region is square and follows the outline of the chip 1. On its front face 2, the chip 1 also includes, in two regions that lie between the opposed edges 4 and 5 and the corresponding edges of the central region 3, two series of transverse electrical connection areas 6 and 7 on the surface.

Figure 2:
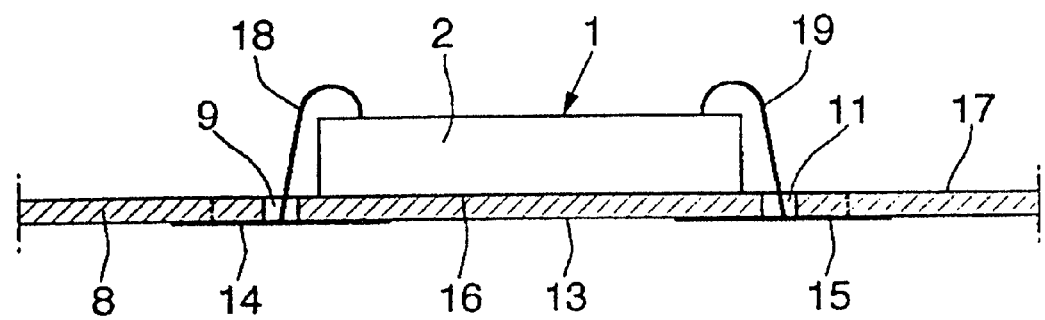
FIG. 2 shows a cross section of the semiconductor device of FIG. 1.

Referring to FIGS. 1 and 2, a thin film 8 of plastic (such as epoxy) has multiple through-holes 9 in a bonding area 10 and multiple other through-holes 11 in a bonding area 12. The bonding areas 10 and 12 are separated by a distance that is at least equal to the distance that separates the opposed edges 4 and 5 of the chip 1. On its rear face 13, the film 8 has multiple metal electrical connection areas 14 which pass in front of the respective through-holes 9 and multiple metal electrical connection areas 15 which pass in front of the respective through-holes 11. These metal areas 14 and 15 are made beforehand (for example, by screen printing).

In order to encapsulate the chip 1 so as to form a package, the following procedure is used in this embodiment of the present invention. The rear face 16 of the chip 1 is fastened by cement to the front face 17 of the film 8 in a position such that the chip extends between the bonding areas 10 and 12 and its edges 4 and 5 lie alongside the bonding areas 10 and 12, respectively. Next, the electrical connection areas 6 on the chip 1 are connected to the rear electrical connection areas 14 on the film 8 through the through-holes 9 by floating electrical connection wires 18. Likewise, the transverse electrical connection areas 7 on the chip 1 are connected to the rear electrical connection areas 15 on the film 8 through the through-holes 11 by floating electrical connection wires 19.

As shown in FIG. 1, through-holes 9 and through-holes 11 are respectively formed as close as possible to edges 4 and 5 of the chip 1 that is fastened to the film 8, at a distance that is compatible with the operating characteristics of an automatic machine for positioning the connection wires 18 and 19. In addition, the through-holes 9 and 11 are respectively formed in spaces 20 and 21 that extend between the edges 4 and 5 of the chip 1 and a virtual circle 22 that passes through the corners of the chip 1 or in the vicinity of these corners.

Figure 3:
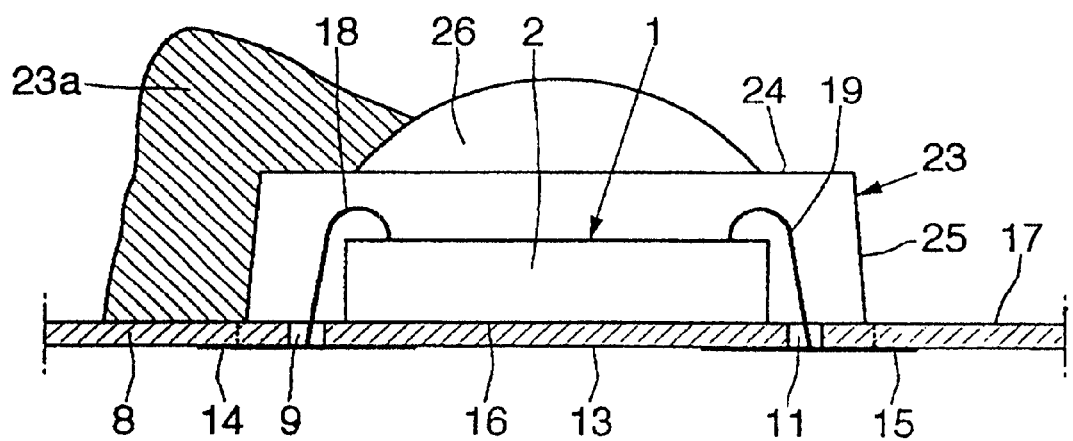
FIG. 3 shows a cross section of the semiconductor device after a second step of the process.
Figure 4:
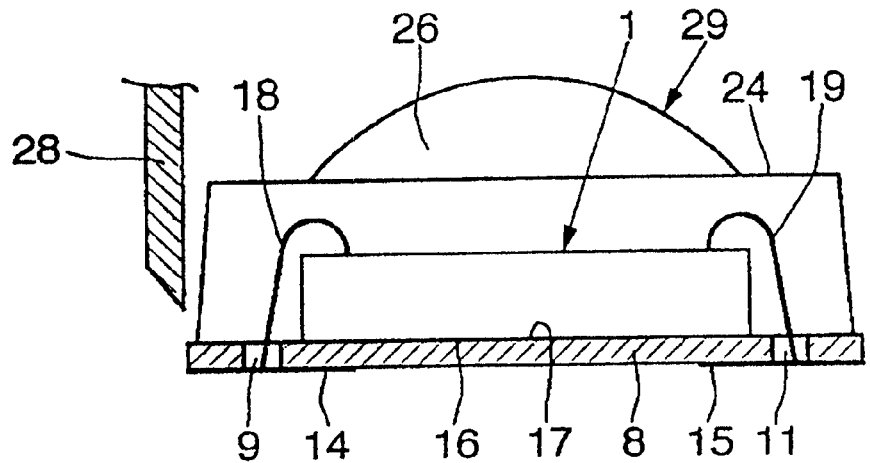
FIG. 4 shows a cross section of the semiconductor device after a third step of the process.
Figure 5:
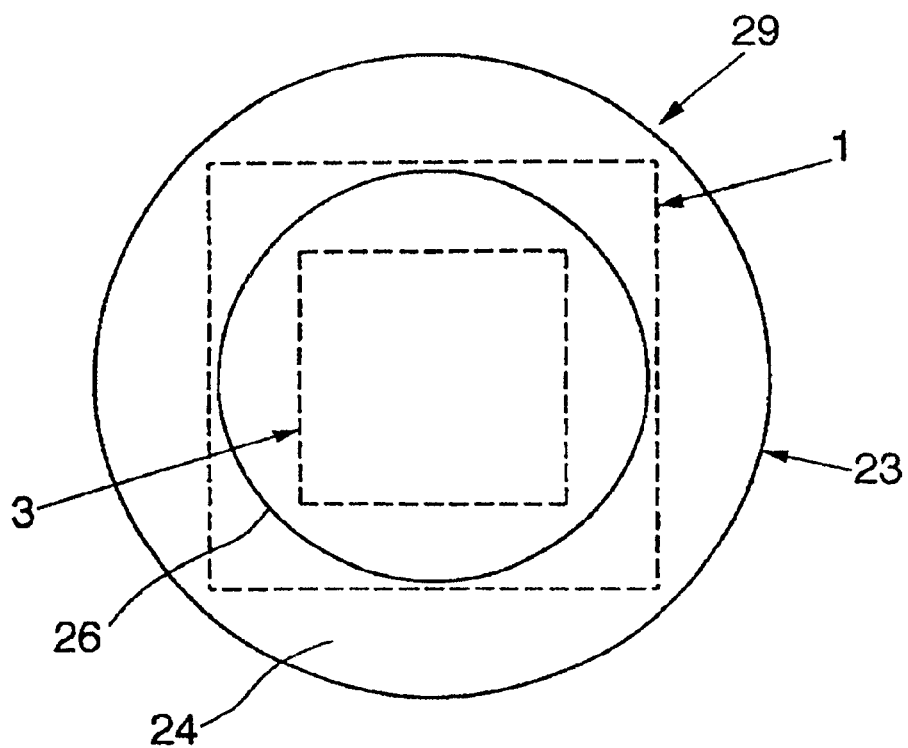
FIG. 5 shows a top view of the semiconductor device.

Next, as shown in FIG. 3, an encapsulating block 23 of optically transparent plastic is molded in a mold 23a (partially shown) above the front face 17 of the film 8. Thus, the chip 1 and the electrical connection wires 18 and 19 are embedded in the encapsulating block 23, which is composed of a material such as an epoxy resin. As shown in FIGS. 3 through 5, the block 23 has a front face 24 that is parallel to the front face 2 of the chip 1, and a circular, straight, or slightly tapered perimeter 25 that passes in the vicinity of the corners of the chip 1, preferably as close as possible to them. In one exemplary embodiment, the front face 24 of the block 23 advantageously has, in its central region, a domed projecting part 26 that forms an optical lens facing the central region 3 with the sensors.

Then, as shown in FIG. 4, the film 8 is cut along the perimeter 25 of the block 23, as close as possible to the perimeter (for example, by punching using a punch 28). Thus, a sealed package 29 having a small footprint and a circular perimeter is produced. This package may be easily fitted into a tubular support. The electrical connection areas 14 and 15 on the rear face 13 of the package 29 can be electrically connected in any conventional manner (for example, by bonding the electrical connection wires or by depositing drops of a coupling solder material).

The process described above can be carried out at various points on one film 8 so as to simultaneously produce several packages 29 on the same film. In such a case, the molding operation is common and each package is then separated (for example, in a single operation by punching).

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A machine-readable medium encoded with a program for packaging an integrated circuit chip, the chip having a front face with sensors located in a central region and with electrical connection areas located in a region that lies between at least one edge of the chip and the central region, said program containing instructions for performing the steps of:

cementing a rear face of the chip to a front face of a substrate that includes through-holes, the rear face of the substrate including electrical connection areas that pass in front of the through-holes such that the through-holes are located laterally with respect to the edge of the chip;

connecting the electrical connection areas on the front face of the chip to the electrical connection areas on the substrate through the through-holes;

embedding the chip in an encapsulating material so as to form an encapsulating block on the same side as the front face of the substrate, the encapsulating material being optically transparent; and cutting the substrate around the encapsulating block, following the perimeter of the encapsulating block.

2. The machine-readable medium as defined in claim 1, wherein in the connecting step, the electrical connection areas on the front face of the chip are connected to the electrical connection areas on the substrate using connection wires, and in the embedding step, the connection wires are also embedded in the encapsulating material.

3. The machine-readable medium as defined in claim 1, wherein in the embedding step, the encapsulating block is formed so as to have a perimeter that is circular, and in the cutting step, the substrate is cut along the circular perimeter of the encapsulating block.

4. The machine-readable medium as defined in claim 1, wherein in the cutting step, the substrate is cut by punching.

5. A semiconductor package including optical sensors, said semiconductor package comprising:

an integrated circuit chip having a front face with sensors in a central region and electrical connection areas in a region between at least one edge and the central region;

a substrate having through-holes, a front face fastened to a rear face of the chip, and a rear face having electrical connection areas that pass in front of the through-holes and are located laterally with respect to the edge of the chip;

electrical connectors connecting the connection areas on the front face of the chip to the electrical connection areas on the substrate through the holes; and an encapsulating material forming an encapsulating block in which the chip and electrical connectors are embedded, the encapsulating material of the encapsulating block at least partially filling the through-holes in the substrate, wherein the encapsulating block is affixed to the front face of the substrate, the encapsulating material is optically transparent, and the perimeter of the substrate follows the perimeter of the encapsulating block.

6. The semiconductor package as defined in claim 5, wherein the electrical connectors are electrical connection wires that pass through the holes in the substrate.

7. The semiconductor package as defined in claim 5, wherein the perimeter of the encapsulating block is circular.

8. The semiconductor package as defined in claim 7, wherein the front face of the encapsulating block has a domed part that forms an optical lens.

9. The semiconductor package as defined in claim 8, wherein the semiconductor package is fabricated by a method comprising the steps of:

cementing the rear face of the chip to the front face of the substrate, the rear face of the substrate including the electrical connection areas that pass in front of the through-holes such that the through-holes are located laterally with respect to the edge of the chip;

connecting the electrical connection areas on the front face of the chip to the electrical connection areas on the substrate through the through-holes;

embedding the chip in the encapsulating material so as to form the encapsulating block on the same side as the front face of the substrate, the encapsulating material being optically transparent; and cutting the substrate around the encapsulating block, following the perimeter of the encapsulating block.

10. The semiconductor package as defined in claim 9, wherein in the connecting step of the method of fabrication, the electrical connection areas on the front face of the chip are connected to the electrical connection areas on the substrate using connection wires, and in the embedding step of the method of fabrication, the connection wires are also embedded in the encapsulating material.

11. The semiconductor package as defined in claim 9, wherein in the embedding step of the method of fabrication, the encapsulating block is formed so as to have a perimeter that is circular, and in the cutting step of the method of fabrication, the substrate is cut along the circular perimeter of the encapsulating block.

12. The semiconductor package as defined in claim 9, wherein in the cutting step of the method of fabrication, the substrate is cut by punching.

13. The semiconductor package as defined in claim 6, wherein the encapsulating material of the encapsulating block completely fills the through-holes in the substrate so as to embed the entirety of the chip and the entirety of the electrical connection wires within the encapsulating material.

14. A semiconductor package including optical sensors, said semiconductor package comprising:

an integrated circuit chip having a front face with sensors in a central region and electrical connection areas in a region between at least one edge and the central region;

a substrate having a front face fastened to a rear face of the chip, and a rear face having electrical connection areas that pass in front of the through-holes and are located laterally with respect to the edge of the chip;

electrical connectors connecting the connection areas on the front face of the chip to the electrical connection areas on the substrate through the holes; and an encapsulating material forming an encapsulating block in which the chip and electrical connectors are embedded, wherein the encapsulating block is affixed to the front face of the substrate, the encapsulating material is optically transparent, the perimeter of the substrate follows the perimeter of the encapsulating block, and the front face of the encapsulating block has a domed part that forms an optical lens.

15. The semiconductor package as defined in claim 5, wherein the front face of the encapsulating block is flat.

16. A semiconductor package including optical sensors, said semiconductor package comprising:

an integrated circuit chip having a front face with sensors in a central region and electrical connection areas in a region between at least one edge and the central region;

a substrate having a front face fastened to a rear face of the chip, and a rear face having electrical connection areas that pass in front of the through-holes and are located laterally with respect to the edge of the chip;

electrical connectors connecting the connection areas on the front face of the chip to the electrical connection areas on the substrate through the holes; and an encapsulating material forming an encapsulating block in which the chip and electrical connectors are embedded, wherein the encapsulating block is affixed to the front face of the substrate, the encapsulating material is optically transparent, the perimeter of the substrate follows the perimeter of the encapsulating block, and a side wall of the encapsulating block is at least partly frustoconical.

17. The semiconductor package as defined in claim 5, wherein the substrate is a film of epoxy resin having screen-printed or laminated electrical connection areas.

18. The semiconductor package as defined in claim 5, wherein the perimeter of the encapsulating block substantially passes the corners of the chip.

19. An information processing system that includes at least one semiconductor package having optical sensors, said semiconductor package comprising:

an integrated circuit chip having a front face with sensors in a central region and electrical connection areas in a region between at least one edge and the central region;

a substrate having through-holes, a front face fastened to a rear face of the chip, and a rear face having electrical connection areas that pass in front of the through-holes and are located laterally with respect to the edge of the chip;

electrical connectors connecting the connection areas on the front face of the chip to the electrical connection areas on the substrate through the holes; and an encapsulating material forming an encapsulating block in which the chip and electrical connectors are embedded, the encapsulating material of the encapsulating block at least partially filling the through-holes in the substrate, wherein the encapsulating block is affixed to the front face of the substrate, the encapsulating material is optically transparent, and the perimeter of the substrate follows the perimeter of the encapsulating block.

20. The information processing system as defined in claim 19, wherein the electrical connectors are electrical connection wires that pass through the holes in the substrate.

21. The information processing system as defined in claim 19, wherein the perimeter of the encapsulating block is circular.

22. The information processing system as defined in claim 19, wherein the front face of the encapsulating block has a domed part that forms an optical lens.

23. The information processing system as defined in claim 19, wherein the substrate is a film of epoxy resin having screen-printed or laminated electrical connection areas.

24. The information processing system as defined in claim 20, wherein the encapsulating material of the encapsulating block completely fills the through-holes in the substrate so as to embed the entirety of the chip and the entirety of the electrical connection wires within the encapsulating material.

* * * * *